United States Patent [19]
Granot

[11] Patent Number: 4,832,037
[45] Date of Patent: May 23, 1989

[54] MULTI-REGION IN-VIVO MAGNETIC RESONANCE SPECTROSCOPY

[75] Inventor: Joseph Granot, Holon, Israel

[73] Assignee: Elscint Ltd., Haifa, Israel

[21] Appl. No.: 169,116

[22] Filed: Mar. 9, 1988

Related U.S. Application Data

[63] Continuation of Ser. No. 892,063, Aug. 1, 1986, abandoned.

[30] Foreign Application Priority Data

Aug. 2, 1985 [IL] Israel ........................................ 76009

[51] Int. Cl.⁴ ............................................. A61B 5/05
[52] U.S. Cl. ..................................... 128/653; 324/307
[58] Field of Search ................ 128/653; 324/307, 309

[56] References Cited

U.S. PATENT DOCUMENTS

| | | | |
|---|---|---|---|
| 4,318,043 | 2/1982 | Crooks et al. | 324/309 |
| 4,458,203 | 7/1984 | Young | 324/309 |
| 4,509,011 | 4/1985 | Sugimoto et al. | 324/309 |
| 4,531,094 | 7/1985 | Ordidge et al. | 324/309 |
| 4,558,277 | 12/1985 | Post et al. | 324/309 |
| 4,558,278 | 12/1985 | Young | 324/309 |
| 4,568,880 | 2/1986 | Sugimoto | 324/309 |
| 4,602,641 | 7/1986 | Feinberg | 128/653 |
| 4,651,096 | 3/1987 | Buonocore | 324/309 |

Primary Examiner—Max Hindenburg
Attorney, Agent, or Firm—Sandler & Greenblum

[57] ABSTRACT

A method of acquiring in-vivo magnetic resonance spectroscopic data for multiple regions in substantially the time required to obtain such data from a single region. The method includes applying a basic sequence to obtain data from a selected one of said multiple regions, waiting a definite time period before reapplying the basic sequence and reapplying modified basic sequences during said definite time period but with parameters for selecting and acquiring data from other selected regions during said definite time period.

12 Claims, 3 Drawing Sheets

MULTI-REGION IN-VIVO MAGNETIC RESONANCE SPECTROSCOPY

This application is a continuation of application Ser. No. 892,063, filed Aug. 1, 1986, now abandoned.

FIELD OF THE INVENTION

This invention is concerned with in-vivo spectroscopy and more particularly with improvements in such spectroscopy when using magnetic resonance imaging (MRI) equipment.

BACKGROUND OF THE INVENTION

One of the advantages of magnetic (MRI) diagnostic imaging is that in addition to imaging data the MRI equipment can be used for acquiring spectroscopic data which may be graphically displayed. The spectroscopic data reveal specific clinical information about biological components. Magnetic resonance was used in spectroscopy even prior to the advent of magnetic resonance diagnostic imaging equipment. In magnetic resonance spectroscopy, the magnetic resonance equipment is used for providing data and/or graphical (spectrum) displays rather than an image of the patient.

In both magnetic resonance spectroscopy (MRS) and in MRI the patient is subjected to a very large static magnetic field. Certain types of nuclei, such as protons i.e. hydrogen nuclei, phosphorus nuclei, carbon nuclei align themselves as "spins" with the static magnetic field on a statistical basis to provide a net magnetic force "M" in the direction of the large static magnetic field. The aligned spins precess about the axis of the static magnetic field at the Larmor frequency. In MRI or in-vivo MRS, gradient fields are applied to localize the effects of a radio frequency Rf pulse. A radio frequency pulse having a frequency equal to the Larmor frequency of a particular element will cause the aligned spins of that element to nutate, i.e. rotate toward a plane transverse to the axis of the static magnetic field.

The Larmor frequency is defined as:

$$f = \gamma B_o / 2\pi \text{ where:}$$

$B_o$—is equal to the strength of the static magnetic field, and $\gamma$—is the gyromagnetic constant for each element.

When the Rf pulse is removed then the nutated spins rotate toward the original aligned position. The component of the nutated spins in the transverse plane defocuses and while precessing it generates a signal known as the free induction decay (FID) signal. It is this signal which is detected and used for providing the spectroscopic data which may be graphically displayed. In in-vitro MRS where the samples are small the whole sample may be subjected to an Rf pulse. In in-vivo MRS where the samples are larger a magnetic gradient pulse is supplied simultaneously with the Rf pulse to localize the Rf pulse.

If a complete volume of a sample is subjected indiscriminately to the Rf pulse then the spectroscopic data reveals quantitatively spectroscopic information on all of the elements or nutated within the sample. However, for diagnostic purposes it is imperative to know the location of the energized or nutated elements. Thus location information is required in addition to the quantitative spectroscopic data. For example, if a woman's breast is being examined, for diagnostic purposes by phosphorus MRS it is important to know precisely the region in the breast from which the spectroscopic data was obtained. It is also imperative to find areas where there is no phosphorus, since high concentrations of certain phosphorus compounds in a breast may be an indication of malignancy in the breast. A comparison of a section of the breast containing phosphorus compounds with the section that does not indicate phosphorus is important to assure the reliability and integrity of data obtained.

Accordingly, it is important to obtain data on more than one section of the patient being examined. For the purposes of this invention the sections may be planes or volumes.

In the past to obtain spectroscopic data on different sections of the patient, a first scan sequence was performed to obtain the data from a first section and subsequently a second scan sequence was performed to acquire the data from the second section. If data from ten sections were desired then ten different scan sequences were run. In spectroscopy, where the data is obtained from elements, such as phosphorus, sodium, or carbon, which are much less prevalent than hydrogen the signals are extremely weak. Accordingly, to enhance the signal-to-noise ratio, it is customary to run between 100 to 1000 scans of the same section to obtain averages that give a sufficiently improved signal-to-noise-ratio to provide useful data. Thus, where a plurality of sections were scanned the time required for the complete scan in the prior art was the basic scan time multiplied by the number of scans of the same section necessary for averaging purposes, multiplied by the number of sections from which data was required.

It has always been an aim of the scientists involved in developing magnetic resonance equipment for diagnostic purposes whether for use in imaging or spectroscopy to decrease the time required for data acquisition. The reasons for the continuing attempts to decrease the data acquisition time are fairly obvious. From a practical stand-point the less time required for each scan the more patients can be put through the equipment. Obviously, the more patients that can be examined using the equipment the more the cost per patient will be reduced. In addition a patient's comfort is always a major consideration. The longer the patient has to be immoblized for examination the greater the patient's discomfort. Also it should be understood that not only it is comfort of the patient involved, but also the results. The longer the test takes the more chance there is of voluntary or involuntary movement by the patient.

Accordingly, it is a prime objective of scientist in the magnetic resonance diagnostic field to increase throughput and decrease the scan time per patient.

More particularly, it is an object of the present invention to provide a method of acquiring in-vivo spectroscopic data from multiple regions of a patient in substantially the time required to acquire in-vivo spectroscopic data in a single region.

BRIEF DESCRIPTION OF THE INVENTION

In accordance to the present invention a method of acquiring in-vivo magnetic resonance spectroscopic (MRS) data from multiple regions of a patient in substantially the time required to acquire in-vivo spectroscopic data from a single region is provided, said method comprising the steps of:

subjecting the patient to a strong static magnetic field, using a basic sequence to obtain first signals from a given region, said basic sequence comprising:

applying a first radio frequency (Rf) pulse during the application of a magnetic gradient pulse, sampling signals generated responsive to the application of the first pulse, waiting a definite time period before reapplying said first Rf pulse, and repeating the basic sequence during the waiting time with Rf pulses of different frequencies, said different frequencies selected to obtain signals from different regions perpendicular to the direction of the gradient, whereby signals are obtained from a plurality of regions during substantially the same time as signals are obtained from a single region.

A feature of the invention comprises the steps of providing planar regions, said planar regions being obtained through the use of planar gradients and wherein the Rf pulse is substantially selective.

A further feature of the invention comprises obtaining FID signals from the given regions where the regions are volumes.

A futher feature of the invention comprises the use of two or three gradients to obtain the FID signals from a volume, using a selective Rf pulse. When these gradients are used a cube like volume of the patient is selected.

Yet another feature of the invention is the use of a probe and related equipment that is capable of being tuned for receiving and transmitting at the plurality of different frequencies used to select the different regions. The probe and related equipment should not require special tuning for each of the different frequencies used. Thus this invention contemplates using either broad band equipment or more particularly a probe such as that provided and described in the U.S. Pat. No. 4,691,163 which issued on Sept. 1, 1987 bearing the title "Dual Frequency Surface Probe" and which is assigned to the assignee of this invention.

The above named and other features and objects of the present invention will be better understood when considered in the light of the following description taken in conjunction with the accompanying drawings; wherein:

GENERAL DESCRIPTION

Figure 1:
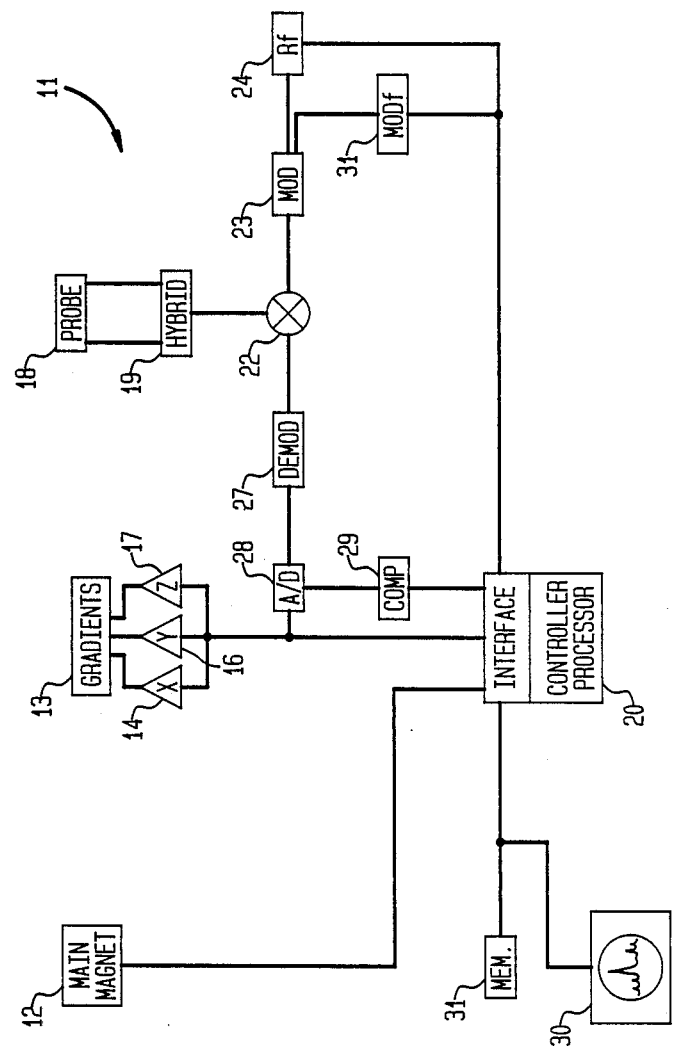
FIG. 1 is a block diagram showing of a magnetic resonance system which may be used in connection with the methods of the present invention.

It should be understood that the equipment and methods described herein can be used to provide either spectroscopic data and spectrum displays or diagnostic data and images or both. The equipment is generally shown in FIG. 1 as magnetic resonance spectroscopic and/or imaging equipment 11. The equipment includes a main magnet 12 which provides the large static magnetic field required for magnetic resonance spectroscopic data and/or image data acquisition. There is also shown gradient equipment 13 which comprises gradient coils, not shown, properly oriented within the main magnet structure 12 and providing X,Y and Z gradients. More particularly an X gradient current generator 14 is provided along with the Y gradient current generator 16 and the Z gradient current generator 17. These gradient generators provide the current which is then supplied to the coils under the control of control-processor 20 connected to the various equipment through interface means 21.

To transmit and receive Rf pulses and signals a coil indicated as probe 18 is provided. In spectroscopy to improve sensitivity special coils, termed surface coils are used. The probe 18 represents all types of Rf coils including surface coils. Probe 18 is connected through a matching circuit, i.e. hybrid means 19 to a switching means 22. The switching means 22 determines whether the coil of the probe 18 is in the transmitting or receiving mode. In the transmitting mode the probe is shown connected to transmit a shaped Rf pulse. The shaping of the Rf pulse is obtained using modulator 23. The Rf carrier signal is provided by the Rf generator 24. The shaping is provided by the modulator frequency generator 26.

It should be understood that within the scope of this invention unshaped radio frequency pulses can also be used.

In the receiving mode the signals picked up by the probe are transmitted through the hybrid 19 and the switch 22 to a demodulator amplifier 27. The demodulator amplifier is shown as having its output connected to analog to digital converter (ADC) 28. The output of the ADC is coupled to a computer 29. In a preferred embodiment the signals from the ADC are averaged. The averaged digital signals are processed for graphic or pictoral display on the display unit 30. A memory unit 31 is also provided for use in processing the data for display on the video type display unit 30.

Figure 2:
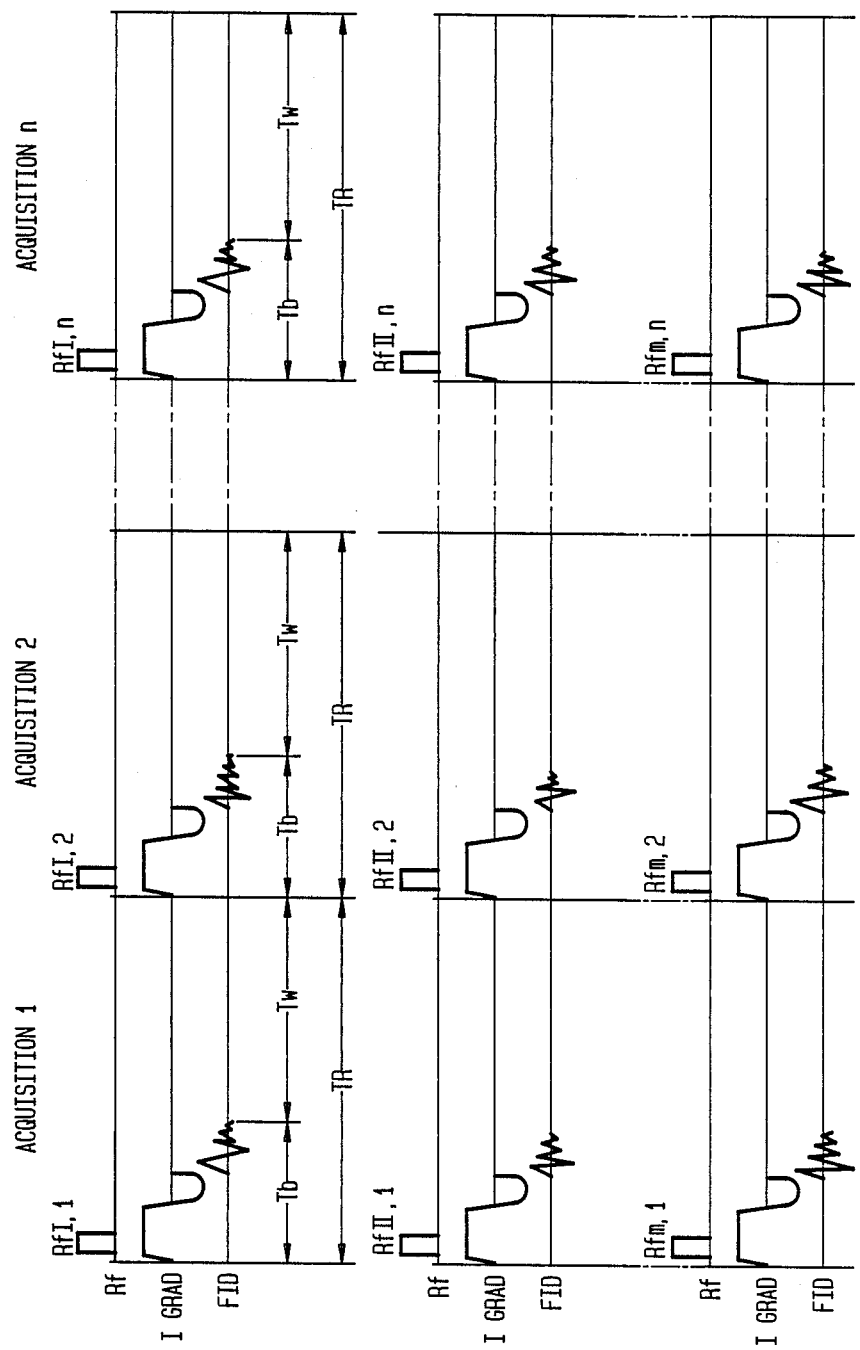
FIG. 2 is a prior art showing of scan sequences used in collecting spectroscopic data from different regions of a patient.

FIG. 2 is a showing of the prior art scan sequences used in obtaining data for spectroscopic use from a plurality of regions in a subject, or patient. More particularly the figure shows the scan sequences used in acquiring data from different regions, indicated at I, II . . m. The data is acquired from each of the m regions in n lines for averaging purposes. The scan sequences of FIG. 2 comtemplates data acquisition from elements such as phosphorus wherein averaging is normally used. In such elements the signals are particularly weak and to obtain a useable signal-to-noise ratio a large number of sequences are run for averaging purposes. It is not unusual to run anywhere between 100 and 1000 image acquisition sequences for averaging purposes.

It should be understood that the inventive method applies even where averaging is not used. However, it is particularly useful and saves even more time when it is applied for acquiring data from phosphorus, sodium or the other elements not as prevalent as hydrogen. It should be further understood while a particular scan sequence is shown, any of the other sequences used in acquiring spectroscopic data can also be used within the scope of this invention. Thus the sequence shown is exemplary only.

As shown in FIG. 2, data is acquired in region I by applying an Rf pulse RfI of a first frequency, during the application of a gradient pulse. The gradient pulse is shown as having an opposite going portion for refocusing purposes. Shortly after the end of the gradient pulse, the FID signal is received. As is well known the frequency of the Rf pulses along with the gradient values determines the locations of the imaging region. The imaging region can be a plane or a volume.

Note that the basic sequence shown as Tb includes the time for the application of the Rf pulse, the gradient pulse and for receving the FID signal. After that a waiting time TW is shown. The waiting time is dependent on the longitudinal relaxation time T1 known to those skilled in the art. For example, the time of the basic sequence could be approximately 200 milliseconds, while the waiting time could be in the nature of 1800 milliseconds, whereby the repetition time TR would be 2 seconds. The repetition time is defined herein as Tb+TW i.e. the time for one basic sequence including the waiting time if the waiting time is necessary.

When averaging is used then the basic sequence and waiting time are repeated a number of repetition times n to obtain a useable signal-to-noise ratio. Data from the second region is acquired, in the prior art after substantially the complete acquisition of data from the first region. In other words a second complete scanning sequence is run. The second scanning sequence is primarily the same as the first scanning sequence except that the radio frequency is changed to obtain data from a different region. Sufficient repetitions n of the basic scan sequence for the second region are run to obtain a useable signal-to-noise ratio.

The scan signals are continued for the number of regions m desired by changing the frequency of the Rf pulse, for example, to obtain data from the different regions. The time necessary for a complete measurement is m* n* TR. Thus the total time for obtaining data from three regions with 1000 averages for each of the regions and with TR equal to 2 seconds is 6000 seconds or approximately an hour an forty minutes—much too long!

Figure 3:
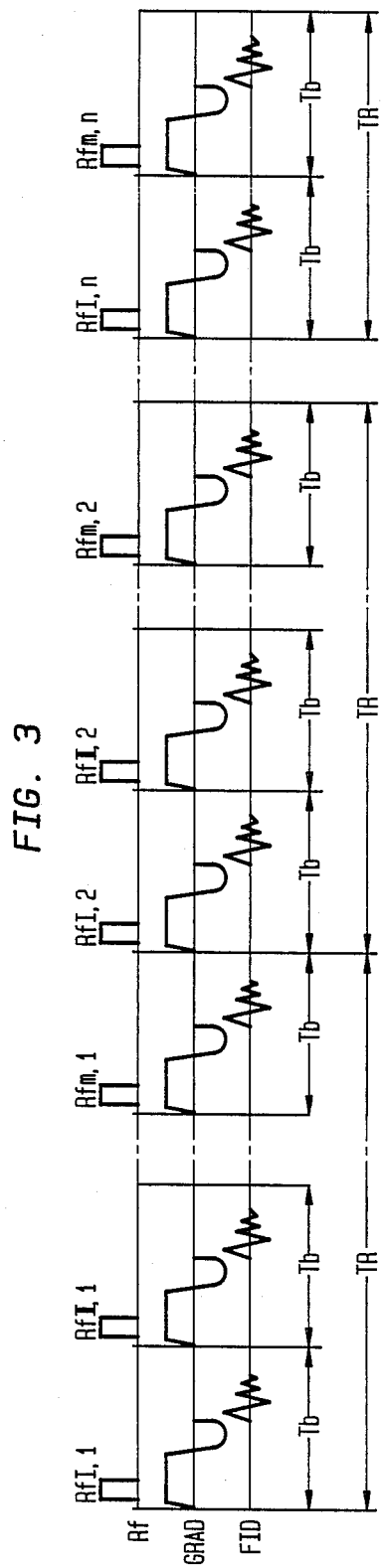
FIG. 3 is a showing of a scan sequence used in accordance with the present invention.

The scan sequence method of the invention is shown in FIG. 3. Therein the first Rf pulse RfI of a first frequency is applied to excite a first region I during the application of the gradient pulse. Shortly after the end of the gradient pulse the first FID signal is received. Instead of waiting during the waiting time period TW after the termination of the first FID signal, an Rf pulse of a second frequency RfII is applied simultaneously with the application of the gradient pulse to select a second region II. A second FID signal is received, generated responsive to the application of the second Rf pulse. Each Rf pulse is repeated n times in the presence of its gradient pulse for averaging purposes. Each repetition time TR now encompasses a plurality of Rf pulses of different frequencies, i.e. RfI, RfII . . . Rfm. The maximum number of Rf pulses having different frequencies that can be applied is determined by the equation:

$$m(Max) = TR/Tb, \text{ where:}$$

$m(M\&*)$ is the maximum number of Rf pulses having different radio frequencies,
TR is the repetition time, and
Tb is the basic sequence time.

The total measurement time is M*TR which means there is a savings factor of nm relative to the prior art.

Thus in the example given where the repetition time TR is two seconds and basic sequence Tb is 200 milliseconds then the maximum number of regions is 10 and the total time will be about 33 minutes to get data from the 10 regions using 1000 scans per region for averaging. Thus the data for 10 different regions can be acquired in the time previously used in acquiring data from a single region. All of the data from the 10 different regions can be acquired in a little over half an hour even if the averaging is accomplished using the 1000 scans per region.

Figure 5:
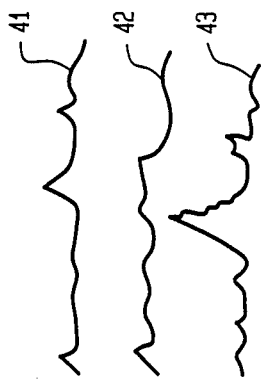
Figure 4:
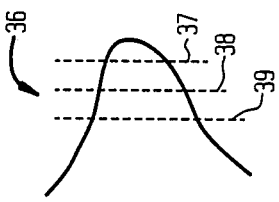
FIG. 4 is a pictorial profile showing of a woman's breast intersected by three scan planes, and FIG. 5 are the spectrum displays of the three planes.

FIG. 4 is a pictorial showing of a woman's breast 36 having three planes 37, 38 and 39 traversing the breast. Data is acquired in accordance with this invention. The data is graphically shown in FIG. 5 at 41, 42, and 43 for each of the plane respectively. The spectrum of the breast tissue at 41 and 42 do not show phosphorus resonances. The spectrum at 43 do show phosphorus resonances indicating phosphorus compounds in the breast muscle.

The method described herein is used for acquiring the spectroscopic data from different regions of the woman's breast for diagnostic purposes. The regions are selected as described herein by selecting different frequencies and applying these different frequencies along with gradients or a gradient during the waiting time of the other applied Rf pulses. The method enables the acquisition of data from a multiplicity of regions in the time required for acquiring data from a single region.

While the invention has been described utilizing selective 90 degree pulses for generating FID signals from selected regions, it should be understood that the basic sequence can also be a spin echo type sequence or any of the echo generating type sequences. The criteria is that the basic sequence generates signals from desired regions. In addition, volumes can be selected by the basic sequence in place of regions.

While the invention has been described using particular embodiments and methods it should be understood that these embodiments and methods are used by way of example only and not as limitations on the scope of the invention.

What is claimed is:

1. A method for acquiring in-vivo magnetic resonance spectroscopic data for multiple stationary regions of a patient in substantially the time required to obtain such data from a single stationary region, where regions are plural dimensional planar sections, the method comprising the steps of:

subjecting the patient to a strong static magnetic field, applying a basic sequence to obtain spectroscopic data from a selected one of said multiple regions, said basic sequence including the steps of:

applying a first gradient pulse to a first gradient coil unit, said first gradient coil unit generating a first gradient field defined by the first gradient pulse applied to said first gradient coil unit, applying a first radio frequency (RF) pulse in the presence of said first gradient field, said first RF pulse and said first gradient field having parameters for selecting a first single region in said patient, acquiring spectroscopic data from said first single region during an absence of any gradient pulses, waiting a definite period of time before reapplying said basic sequence to again select said first single region, reapplying the basic sequence during the definite period using said first gradient coil with RF pulses and gradient pulses of different parameters for selecting other regions than said first single region and for acquiring spectroscopic data during the absence of any gradient pulses from said other regions in said patients during said definite period.

2. The method of claim 1 where the different parameters including RF pulses having different frequencies.

3. The method of claim 2 wherein the steps of reapplying the basic sequence includes the steps of applying m RF pulses of different frequencies to select m regions of the patient, and applying n RF pulses of the same frequency to obtain n FID signals for each of the m RF pulses, and averaging said n signals to obtain a useful signal-to-noise ratio.

4. The method of claim 1 where said different parameters include gradient pulses of different values.

5. The method of claim 1 wherein said basic sequence comprises detecting echo signals.

6. The method of claim 1 wherein the step of applying said gradient pulse includes applying a refocusing portion to said applied gradient pulse.

7. The method of claim 1 wherein said basic sequence comprises a time Tb for applying the Rf pulse in the presence of the gradient pulse plus the time to receive the signal generated thereby.

8. The method of claim 7 wherein repetition time TR includes the time Tb required to obtain a signal in a single region responsive to an RF pulse plus waiting time Tw for T1 relaxation in said signal region.

9. The method of claim 8 where the maximum number of regions from which data can be acquired during the time required to obtain data from a single region comprises the time TR divided by the time Tb.

10. The method of claim 1 wherein said regions are volumes and wherein more than one gradient pulse is applied during the application of Rf pulses.

11. The method of claim 1 wherein two gradient pulses are applied during the application of the Rf pulses to select slab like volumes as the regions within the patient.

12. The method of claim 1 wherein three gradients are applied during the application of the Rf pulses to thereby select a box like volume from which signals are acquired.

* * * * *